United States Patent
Hikmet et al.

(10) Patent No.: US 9,556,292 B2
(45) Date of Patent: Jan. 31, 2017

(54) OPTICAL COMPOSITION

(71) Applicant: PHILIPS LIGHTING HOLDING B.V., Eindhoven (NL)

(72) Inventors: Rifat Ata Mustafa Hikmet, Eindhoven (NL); Ties Van Bommel, Horst (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/440,710

(22) PCT Filed: Dec. 17, 2013

(86) PCT No.: PCT/IB2013/061009
§ 371 (c)(1),
(2) Date: May 5, 2015

(87) PCT Pub. No.: WO2014/097130
PCT Pub. Date: Jun. 26, 2014

(65) Prior Publication Data
US 2015/0299348 A1    Oct. 22, 2015

Related U.S. Application Data

(60) Provisional application No. 61/739,793, filed on Dec. 20, 2012.

(51) Int. Cl.
| | | |
|---|---|---|
| C08K 3/30 | (2006.01) | |
| C08F 122/10 | (2006.01) | |
| G02B 1/04 | (2006.01) | |
| C08G 77/398 | (2006.01) | |
| H01L 33/58 | (2010.01) | |
| C08L 83/04 | (2006.01) | |
| B82Y 30/00 | (2011.01) | |
| B82Y 20/00 | (2011.01) | |

(52) U.S. Cl.
CPC .......... *C08F 122/10* (2013.01); *C08G 77/398* (2013.01); *G02B 1/04* (2013.01); *H01L 33/58* (2013.01); *B82Y 20/00* (2013.01); *B82Y 30/00* (2013.01); *C08K 3/30* (2013.01); *C08L 83/04* (2013.01)

(58) Field of Classification Search
CPC ................................ C08K 3/30; C08L 183/04
See application file for complete search history.

(56) References Cited

U.S. PATENT DOCUMENTS

| | | | |
|---|---|---|---|
| 6,833,166 B2 * | 12/2004 | Hikmet | ................ C09K 19/542 349/187 |
| 7,524,746 B2 | 4/2009 | Locascio et al. | |
| 2008/0210965 A1 | 9/2008 | Hung | |
| 2010/0244286 A1 | 9/2010 | Lagsa | |
| 2012/0068118 A1 | 3/2012 | Parce et al. | |
| 2013/0105854 A1 * | 5/2013 | Jang | ........................ H01L 33/56 257/100 |

FOREIGN PATENT DOCUMENTS

| | | | |
|---|---|---|---|
| CN | 1555308 A | | 12/2004 |
| CN | 101146869 A | | 3/2008 |
| EP | 2 584 623 | * | 4/2013 |
| EP | 2584623 A2 | | 4/2013 |
| WO | 02058928 A1 | | 8/2002 |

* cited by examiner

*Primary Examiner* — Margaret Moore

(57) ABSTRACT

The present invention aims to reduce excess scattering in light emitting arrangements. A composition comprising a transparent matrix comprising an anionic organic moiety, and metal cations dispersed in the matrix is disclosed. The anionic organic moiety and the metal cations form an organometallic complex, and wherein the metal cations are capable of forming transparent nano-crystals upon contact with an agent comprising at least one element selected from the group consisting of sulfur and selenium. Also an optical composition comprising a transparent matrix comprising an organic moiety residue, and unmodified nanocrystals is disclosed. Further, a method of preparing an optical composition comprising the steps of: providing a transparent matrix comprising an anionic organic moiety; dispersing metal cations into the matrix; and contacting the organometallic complex with an agent in order to in situ convert at least part of the metal cations into transparent nanocrystals. Preferably the matrix is a silicone or a polysiloxane and silicone rubber mixture.

8 Claims, 4 Drawing Sheets

OPTICAL COMPOSITION

CROSS-REFERENCE TO PRIOR APPLICATIONS

This application is the U.S. National Phase application under 35 U.S.C. §371 of International Application No. PCT/IB13/061009, filed on Dec. 17, 2013, which claims the benefit of U.S. Provisional Patent Application No. 61/739,793, filed on Dec. 20, 2012. These applications are hereby incorporated by reference herein.

FIELD OF THE INVENTION

The present invention relates to a composition, an optical composition as well as a light emitting arrangement and an optical component comprising the optical composition. The present invention also relates to a method of preparing the optical composition.

BACKGROUND OF THE INVENTION

In many light emitting arrangements comprising a solid state light source, e.g. an LED, the solid state light source is encapsulated by a transparent material in order to increase the light extraction of the arrangement and to protect the solid state light source. It is important to use a high refractive index material, e.g. silicones, with a high photochemical stability as encapsulant. The encapsulant comprising the high refractive index material may increase the system efficiency considerably if used in a component, e.g. a wavelength converting member or a transparent cover member, of such light emitting arrangements.

Nanocrystals have been proposed to be dispersed into a matrix of high refractive index material, such as a polymer matrix, e.g. a silicone matrix, in order to increase the refractive index of the matrix further. The nanocrystals are typically prepared and surface-modified before being dispersed into the matrix. The nanocrystals are surface-modified in order to enhance compatibility with the high refractive index material of the matrix. However, this method tends to give rise to excess light scattering due to aggregation of the nanocrystals.

US 2012/0068118 A1 addresses the problem of undesirable light scattering, and proposes a matrix doped with semiconductor nanocrystals which comprise ligands that allow for mixing with various matrix materials, including polymers, such that a minimal portion of light is scattered. A composition that comprises a nanostructure, and a polymeric ligand bound to the surface of the nanostructure is disclosed. The ligand comprises a linear silicone backbone, and one or more nanostructure binding moieties coupled to the silicone backbone.

Still, however, there is a need in the art for high refractive index compositions with further reduced excess light scattering. There is also a need in the art for improved methods of preparation of high refractive index compositions with reduced excess light scattering.

SUMMARY OF THE INVENTION

It is an object of the present invention to at least partly overcome this problem, and to provide an optical composition, and a method of preparing an optical composition, allowing for further reduced light scattering.

A drawback of the prior art is that when starting from nanocrystals in a fluid state carrier, the high mobility of the nanocrystals typically leads to aggregation of nanocrystals. In the present invention, the inventors suggest to perform an in situ formation of nanocrystals within a transparent matrix. In the present invention, a composition comprising a transparent matrix and an organometallic complex is provided. Subsequently, nanocrystals may be formed in situ in the transparent matrix as the organometallic complex is contacted with an agent comprising at least one element selected from the group consisting of sulfur and selenium. The low mobility of the organometallic complex within the transparent matrix serves to hinder and prevent aggregation of nanocrystals.

According to a first aspect of the invention, a composition comprising a transparent matrix comprising an anionic organic moiety, and metal cations dispersed in the matrix is provided. Said anionic organic moiety and said metal cations form an organometallic complex. Further, said metal cations are capable of forming transparent nanocrystals upon contact with an agent comprising at least one element selected from the group consisting of sulfur and selenium.

Advantages of the composition according to the present invention are that there is no need of formation or surface-modification of nanocrystals prior to the preparation of the optical composition. Further, the refractive index of the composition is tunable, depending on the exposure time to the agent comprising at least one element selected from the group consisting of sulfur and selenium. Furthermore, the organometallic complex does not aggregate in the composition, and thus neither do the nanocrystals tend to aggregate upon exposure to said agent. The prevention of aggregation leads to prevention of excess light scattering.

According to an embodiment, the organometallic complex is uniformly dispersed in the matrix.

According to an embodiment, the matrix comprises a polymer and the anionic organic moiety is an anionic organic side group of said polymer.

In an example, the anionic organic side group of the polymer is a carboxylate group selected from the group consisting of e.g. $COO^-$, $HCOO^-$, $CH_3COO^-$, $CH_3CH(OH)COO^-$, $(COO)_2^{2-}$, $C_3H_5O(COO)_3^{3-}$, $C_5H_7O_2^-$, $C_6H_5COO^-$. The anionic organic side group may also be a sulfonate group ($RSO_2O^-$).

According to an embodiment, the matrix is a silicone or a silicone derivative comprising at least one of a polysiloxane and silicone rubber.

According to an embodiment, said metal ion is selected from the group consisting of zinc ions, cadmium ions, and iron ions.

In an example, the composition may further comprise nanocrystals dispersed in the matrix.

In an example, the organometallic complex has reactive groups for chemically attaching to the polymer network of the matrix.

According to a second aspect, the invention provides an optical composition comprising a transparent matrix comprising an organic moiety residue, and unmodified nanocrystals comprising metal cations and at least one element selected from the group consisting of sulfur and selenium, dispersed in the matrix.

An advantage of the optical composition is an increased and tunable refractive index. Further, the transparent nanocrystals do not absorb light. Furthermore, the nanocrystals do not require any surface-modification nor any ligands bound to their surface in order to prevent aggregation.

According to an embodiment, the nanocrystals are uniformly dispersed in the host matrix. The uniform dispersion implies prevention of light scattering by reduction of aggregates of nanocrystals.

According to an embodiment, the optical composition has a refractive index within the range of from 1.6 to 1.9.

According to an embodiment, the matrix is cross-linked.

In an example, the nanocrystals are selected from the group consisting of ZnS, CdS, ZnSe, CdSe, and PbS.

In an example, the organic moiety residue is selected from the group consisting of e.g. COOH, HCOOH, $CH_3COOH$, $CH_3CH(OH)COOH$, $(COOH)_2$, $C_3H_5O(COOH)_3$, $C_5H_8O_2$, $C_6H_5COOH$, $RSO_2OH$. The organic moiety residues are easy to detect in the optical composition.

According to a third aspect, a light emitting arrangement, comprising a solid state light source and an optical composition arranged over said solid state light source, is provided.

According to a fourth aspect, an optical component comprising the optical composition is provided.

In an example, a transparent cover member comprising the optical composition is provided. For instance, the transparent cover member may cover a solid state light source in a light emitting arrangement.

In an example, a wavelength converting member for a light emitting arrangement comprising the optical composition and a wavelength converting material is provided.

In a fifth aspect, the present invention provides a method of preparing an optical composition comprising the steps of:

a) providing a transparent matrix comprising an anionic organic moiety, b) dispersing metal cations into the matrix, such that the anionic organic moiety and the metal cations form an organometallic complex, c) contacting the organometallic complex with an agent comprising at least one element selected from the group consisting of sulfur and selenium, in order to in situ convert at least part of the metal cations into transparent nanocrystals.

The in situ formation of nanocrystals allows for easier and more efficient preparation of optical compositions with reduced excess light scattering. The method is easy, since it does not require a step of surface-modification of the nanocrystals. The method is more efficient since the in situ formation allows for reduced formation of nanocrystal aggregates, and thereby also further reduced excess light scattering. Furthermore, the refractive index of the optical composition may be tuned during preparation of the optical composition.

According to an embodiment, a method of preparing an optical composition comprises the steps of:

a) providing a composition according to the present invention, c) contacting the organometallic complex with an agent comprising at least one element selected from the group consisting of sulfur and selenium, in order to in situ convert at least part of the metal cations into transparent nanocrystals.

According to an embodiment, step c) is carried out until a refractive index of the optical composition corresponding to 100% conversion of the organometallic complex is achieved.

According to an embodiment, the method further comprises a step of cross-linking the matrix by high energy radiation selected from the group consisting of: UV, gamma rays, electrons. The step of cross-linking the matrix may also be performed by heat.

In an example, a method of preparing an optical composition comprising the steps of: preparing a mixture, optionally clear and miscible, comprising reactive monomers and organometallic complex; polymerizing said mixture by using high energy radiation; and contacting the organometallic complex with an agent comprising at least one element selected from the group consisting of sulfur and selenium, in order to in situ reacting at least part of the metal cations to form transparent nanocrystals, e.g. metal sulfinide or selenide. The mixture may be cross-linked to a matrix prior to or after the contacting step.

In an example, the method may further comprise the step of forming a transparent cover member, or a wavelength converting member, comprising the optical composition according to embodiments of the present invention.

In an example, the matrix is provided by polymerization of monomers with reactive groups. For example, polymerization may be an addition reaction. In the case of silicones, the reactive groups may comprise vinyl groups and the cross-linking agent may comprise Si—H groups. The polymerization may be initiated by a catalyst, such as a Pt-catalyst. Also radical initiated polymerization may be used, when the monomers are provided with vinyl groups. In the case of siloxanes, peroxide initiated polymerization is commonly used. Furthermore, polymerization by a condensation reaction may also be used to provide a matrix of cross-linked polymers.

In an example, an optical composition prepared according to the method of the present invention is provided.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

Figure 1:
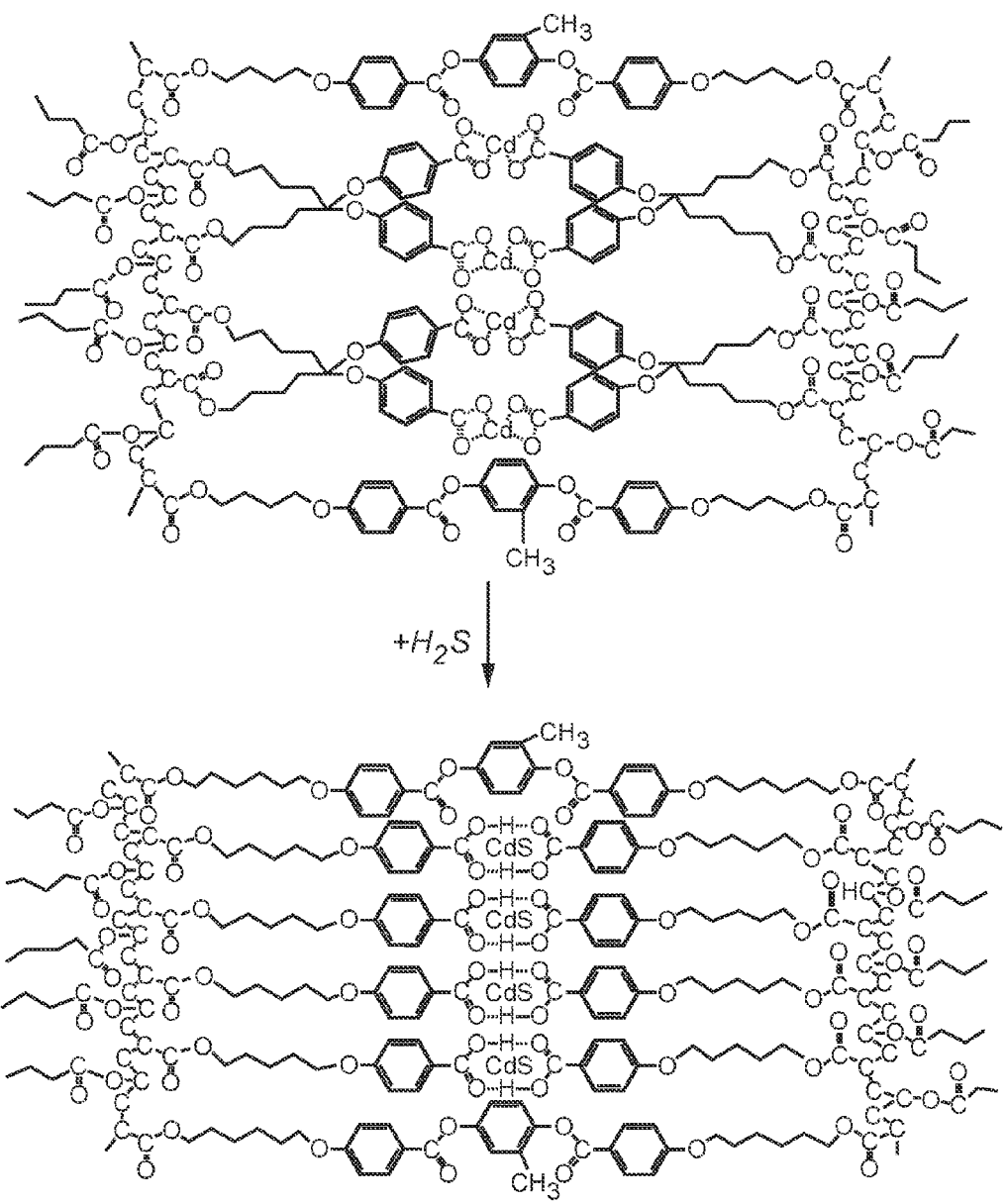
In FIG. 1, a reaction scheme of an in situ formation of nanocrystals according to an embodiment of the present invention is shown.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The present inventors have found that the refractive index of a composition for use in e.g. light emitting arrangements can be increased without increasing light scattering, by forming nanocrystals in situ in the composition.

The composition comprises a transparent matrix comprising an anionic organic moiety, and metal cations dispersed in the matrix. The metal cations and the anionic organic moiety form an organometallic complex. The transparent matrix may be polymerized to provide a chemically cross-linked network. When the dispersed metal cations are contacted with an agent comprising at least one element selected from the group consisting of sulfur and selenium, the metal cations may form nanocrystals with the at least one element selected from the group consisting of sulfur and selenium, in situ in the matrix.

The dispersion of metal cations and the in situ formation of nanocrystals tend to further reduce the risk of aggregation and thereby also the excess light scattering.

By forming the nanocrystals in situ, there is no need of formation or surface-modification of nanocrystals prior to the preparation of the optical composition. Thus, the resulting optical composition may comprise a transparent matrix comprising an organic moiety residue, and unmodified (i.e. not surface-modified) nanocrystals comprising metal cations and at least one element selected from the group consisting of sulfur and selenium dispersed in the matrix.

The term "in situ", is herein used to describe that nanocrystals are not formed prior to contact with the matrix, such as in conventional methods, but within the matrix, when metal cations of organometallic complexes are contacted with an agent comprising at least one element selected from the group consisting of sulfur and selenium.

In an in situ formation of nanocrystals according to the present invention, the mobility of the organometallic complex is much lower than the mobility of the pre-formed nanocrystals of the conventional methods. Thus, the in situ formation of nanocrystals, herein described, tends to reduce the aggregation of nanocrystals, thereby reducing the excess light scattering.

By the term "anionic organic moiety", is herein meant an organic molecule or compound or an organic part of a molecule or compound having more electrons than protons, thus having a negative charge. The anionic organic moiety may be a molecule with anionic organic groups. Alternatively, the anionic organic moiety may be an anionic organic side group of a polymer of a matrix. The anionic organic moiety may be selected from the group consisting of e.g. carboxylate, sulfonate and acetonate groups.

By the term "organic moiety residue", is herein meant the uncharged state of the anionic organic moiety. Typically, the organic moiety residue consists of the anionic organic moiety and an additional hydrogen atom. Examples of organic moiety residues may be selected from the group consisting of e.g. carboxylic acid and sulfonic acid.

By the term "metal cation", is meant a cationic metal ion, i.e. a metal ion having fewer electrons than protons, thus having a positive charge. Examples of metal cations may be selected from the group consisting of e.g. zinc, cadmium, iron. Typically, a divalent metal cation is preferred.

By the term "nanocrystal", is herein meant nanostructures that are substantially monocrystalline. The nanocrystal has at least one dimension of less than 100 nm, typically less than 50 nm, or less than about 1 nm. Nanocrystals may have at least one dimension of about 10 nm. Nanocrystals may be substantially homogeneous in material properties. The optical properties of nanocrystals may be determined by their size, chemical composition or surface composition. Nanocrystals may be made of semiconducting material.

By the term "unmodified nanocrystal", is herein meant nanocrystals that have not been surface-modified before being combined with a transparent matrix. Further, unmodified nanocrystals typically do not have any molecule, compound or ion bound, conjugated, coordinated, attached or associated to their surface.

By the term "organometallic complex", is herein meant the complex that is formed when an anionic organic moiety and metal cations are interacting with each other, e.g. by forming a salt. An organometallic complex may comprise a metal-carbon bond, generally, of character intermediate between an ionic bond and a covalent bond.

By the term "agent comprising at least one element selected from the group consisting of sulfur and selenium", is herein meant a substance comprising an element that may form a nanocrystal with a metal cation of an organometallic complex, when the organometallic complex is contacted with the agent. Typically, the agent is a gas. Examples of agents comprising at least one element selected from the group consisting of sulfur and selenium, may be selected from the group consisting of e.g. $H_2S$ and $H_2Se$.

By the term "uniformly dispersed", is herein meant that metal cations, organometallic complex or nanocrystals, are dispersed in a matrix without forming aggregates or clusters with each other. Thus, the dispersed metal cations, organometallic complex or nanocrystals, according to embodiments of the present invention do not form aggregates or clusters in the matrix that may cause excess light scattering. Preferably, the metal cations, organometallic complex or the nanocrystals, are also uniformly dispersed in the sense that the concentration of metal cations, organometallic complex or nanocrystals, in each sample of the matrix is similar or equal to the average overall concentration of metal cations, organometallic complex or nanocrystal, in the matrix.

By the term "optical component", is herein meant a transparent component suitable for use in an optical device such as a light emitting arrangement. Examples of optical components are lenses, bonding layers, matrix materials for phosphors.

By the term "transparent", it herein meant the physical property of allowing light to pass through the material without being scattered.

In general, the reaction between an agent comprising at least one element selected from the group consisting of sulfur and selenium, e.g. $H_2S$ gas, and a composition comprising a matrix comprising both an anionic organic moiety and dispersed metal cations may be as follows:

$$H_2Y(g)+(M^{2+})(X^-)_2 \rightarrow (M^{2+})(Y^{2-})+2XH \qquad \text{(Eq. 1)}$$

in which Y represents the element selected from the group consisting of sulfur and selenium; $M^{2+}$ represents the metal cation, which may be divalent, e.g. $Zn^{2+}$ or $Cd^{2+}$; $X^-$ represents the anionic organic moiety, e.g. carboxylate groups, such as $COO^-$, $C_5H_7O_2^-$ or $RSO_2O^-$; $(M_{2+})(Y^{2-})$ represents the nanocrystal, e.g. ZnS, CdS, ZnSe, CdSe or PbS; and XH represents the organic moiety residue, e.g. COOH, $C_5H_8O_2$ or $RSO_2OH$. Depending on the oxidation states of the metal cations and the anionic organic moiety, Eq. 1 may have to be adapted with respect to the relative molar amounts of M, X and $H_2Y$.

A transparent matrix according to embodiments of the invention may be a polymer matrix or a siloxane-based matrix. The siloxane-based matrix may comprise silicones, such as polysiloxanes and modified polysiloxanes. The polymer matrix may comprise hydrocarbon polymers, such as polyacrylates. Preferably, the matrix is crosslinkable.

Suitably the matrix material may be capable of forming a complex with the metal cations of the composition. The polymer of the transparent matrix may comprise an anionic organic moiety, e.g. an anionic organic side group. The anionic organic moiety may be selected from the group consisting of carboxylate groups, such as an acetate group, a formate group, a citrate group, a lactate group, an oxalate group, a sulfonate group and acetonate group. The polymer of the transparent matrix may be formed by in situ polymerization of a mixture comprising monomers and an organometallic complex.

FIG. 1 schematically shows an example of a reaction between an organometallic complex comprising an anionic organic moiety and metal cations, and an agent comprising at least one element selected from the group consisting of sulfur and selenium, which typically may take place in a transparent matrix. In this example, the anionic organic moiety is benzoate, i.e. the anionic organic side group of the matrix polymer. The dispersed metal cations are Cd ions. The agent comprising at least one element selected from the group consisting of sulfur and selenium, is dry $H_2S$ gas.

In an example, acrylate monomers, cadmium ions, carboxylate groups may be used in a composition together with a diacrylate. After polymerization of the monomers, a polymer with an anionic organic side group interacting with cadmium ions may be obtained. Upon exposure to e.g. $H_2S$ gas, nanocrystals may be formed in situ within this composition.

Before reaction with $H_2S$, the composition comprises organometallic complex of cadmium cations and anionic organic moieties in a matrix network. In FIG. 1, the matrix network is an acrylate polymer network. Upon reaction with $H_2S$, cadmium sulfide (CdS) nanocrystals are formed, surrounded by the matrix containing organic moiety residues linked to the acrylate polymer network.

In the reaction scheme in FIG. 1, nanocrystals of cadmium sulfide (CdS) are formed, together with organic moiety residues of benzoic acid (RCOOH). The organic moiety residues are typically not bound, conjugated, coordinates, attached or associated to the surface of the nanocrystals.

Before the organometallic complex is contacted with the agent comprising at least one element selected from the group consisting of sulfur and selenium, the interaction between the anionic organic moiety and the metal cations of the organometallic complex may comprise coordinate bonds, also called dipolar bonds, which generally is of a character intermediate between ionic and covalent bonds. After the organometallic complex have been contacted with the agent comprising at least one element selected from the group consisting of sulfur and selenium, the metals cations of the former organometallic complex instead may interact via e.g. ion bonds with the at least one element selected from the group consisting of sulfur and selenium.

Preferably, the organometallic complexes are uniformly dispersed in the transparent matrix before the organometallic complex is contacted with the agent comprising at least one element selected from the group consisting of sulfur and selenium. Preferably, also the nanocrystals are uniformly dispersed in the transparent matrix after that the organometallic complex has been contacted with the agent comprising at least one element selected from the group consisting of sulfur and selenium.

The optical composition according to the invention may be used in a number of applications, such as in optical components, e.g. components utilizing total internal reflection (TIR), so-called TIR optics.

For instance, a transparent cover member (i.e. a transparent component suitable in a light emitting arrangement for covering a solid state light source), e.g. an LED dome of silicone, may comprise the optical composition. A light emitting arrangement may comprise a solid state light source and the optical composition arranged over said solid state light source.

The light sources may be LEDs, UV LEDs or laser diodes, but other light sources are equally conceivable. For instance, the LEDs may be flat-surface LED semiconductors chips, RGB LEDs, direct phosphor converted LEDs, or blue LEDs, violet LEDs, or UV LEDs combined with remote phosphor technology. The light-emitting surfaces may be uncoated, coated, etc.

Figure 2:
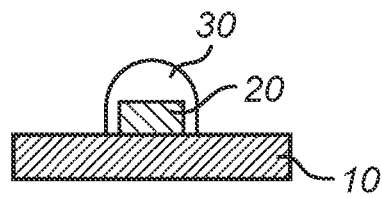
In FIG. 2, a light emitting arrangement comprising a transparent cover member comprising the optical composition according to an embodiment of the present invention is schematically shown.

In FIG. 2, a light emitting arrangement comprising a transparent cover member is schematically shown. The transparent cover member 30 comprising an optical composition according to embodiments of the present invention is arranged over a solid state light source 20. The solid state light source 20 is arranged on a support 10.

A wavelength converting member for a light emitting arrangement (i.e. a component suitable for a light emitting arrangement, therein used to convert light of a first wavelength into light of a second wavelength) may comprise the optical composition and a wavelength converting material. The wavelength converting member may be arranged in direct contact with, in the vicinity of, or remotely from a solid state light source, e.g. an LED.

Examples of suitable organic wavelength converting materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

In some embodiments, the wavelength converting material may be quantum dots or quantum rods. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having very low cadmium content.

The conversion element may also comprise inorganic wavelength converting materials. Examples of inorganic wavelength converting materials include, but are not limited to, cerium (Ce) doped YAG ($Y_3Al_5O_{12}$) or LuAG ($Lu_3Al_5O_{12}$). Ce doped YAG emits yellowish light, whereas Ce doped LuAG emits yellow-greenish light. Examples of other inorganic wavelength converting materials which emit red light may include, but are not limited to ECAS and BSSN; ECAS being $Ca_{1-x}AlSiN_3$:Eu$x$ wherein $0<x\leq1$, preferably 0<x≤0.2; and BSSN being $Ba_{2-x-z}M_xSi_{5-y}Al_yN_{8-y}O_y$:$Eu_z$ wherein M represents Sr or Ca, 0≤x≤1, 0≤y≤4, and 0.0005≤z≤0.05, and preferably 0≤x≤0.2).

Figure 3A:
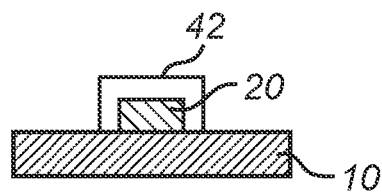
In FIG. 3*a-c*, examples of wavelength converting members comprising the optical composition according to embodiments of the invention and a wavelength converting material are shown.
Figure 3B:
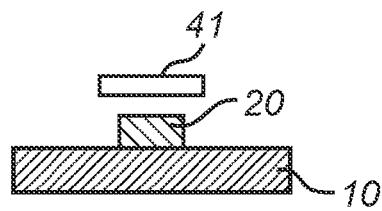
Figure 3C:
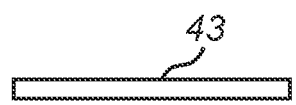
Figure 3C:
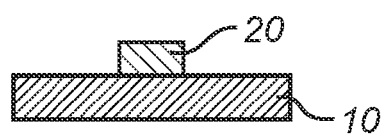

Examples of how a wavelength converting member, comprising the optical composition according to embodiments of the invention and a wavelength converting material, may be arranged in a light emitting arrangement is shown in FIG. 3a-c. In FIG. 3a, a wavelength converting member 42 is arranged in a so-called direct configuration, wherein a wavelength converting member 42 is arranged in direct contact with the solid state light source 20, preferably an LED. The solid state light source 20 may be arranged on a support 10.

In FIG. 3b, a wavelength converting member 41 is arranged in a so-called vicinity configuration, wherein a wavelength converting member 41 is arranged in vicinity to, but not in direct contact with, the solid state light source 20, preferably an LED. The solid state light source 20 may be arranged on a support 10.

In FIG. 3c, a wavelength converting member 43 is arranged in a so-called remote configuration, wherein a wavelength converting member 43 is arranged remotely from the solid state light source 20, preferably an LED. The solid state light source 20 may be arranged on a support 10. In the remote configuration, the wavelength converting member 43 is arranged further away from the solid state light source 20 than the wavelength converting member 41 in the vicinity configuration.

Figure 4A:
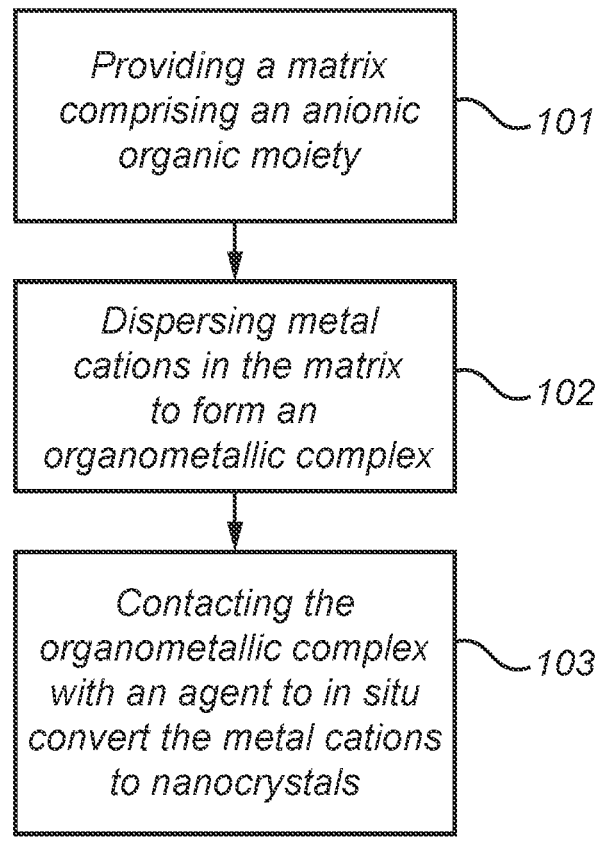
In FIG. 4*a-b*, a method of preparing an optical composition according to an embodiment of the present invention is schematically shown.
Figure 4B:
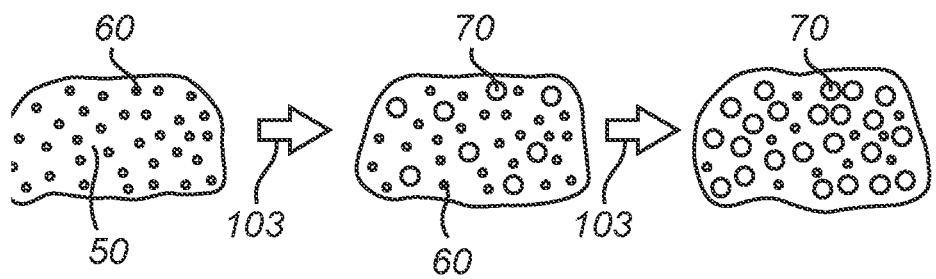

In FIG. 4a-b, a method of preparing an optical composition is schematically shown. FIG. 4a shows a flowchart of the steps in a method according to embodiments of the present invention. FIG. 4b shows the steps figuratively.

A step of providing a transparent matrix comprising an anionic organic moiety 101 may be performed by polymerization of a polymer suitable for the matrix. For example, the matrix may be provided by polymerization of a well mixed mixture of monomers with reactive groups, and optionally also anionic organic moieties, e.g. carboxylic acid groups, with reactive groups.

A step of dispersing metal cations into the matrix, such that the anionic organic moiety and the metal cations form an organometallic complex, 102 may be performed by dispersing metal cations 60 in a matrix 50 by neutralizing the anionic organic moieties by swelling the polymer with a solution of the metal cations, e.g. in form of a metal salt. Preferably, the metal cations 60 form an organometallic complex within the matrix, which preferably is uniformly dispersed in the matrix.

In an alternative method, a composition according to claim 1 may be provided directly, and substitute step 101 and 102 as described above. Instead, the composition according to claim 1 is provided prior to step 103 where the organometallic complex is contacted with an agent to in situ convert the metal cations to nanocrystals.

A mixture of monomers comprising organometallic complex may be provided, and subsequently the monomers may be polymerized. Thereafter, the matrix of polymers comprising organometalic complex may be subjected to e.g. $H_2S$ gas or $H_2Se$ gas to produce metal sulfide nanocrystals and/or metal selenide nanocrystals in situ.

In an example, the contacting of the organometallic complex with an agent to in situ convert the metal cations 60 to nanocrystals 70 may be performed by arranging the matrix 50 comprising the metal cations 60 in a tube of dry $H_2S$ gas during 4 hours at room temperature and atmospheric pressure. The exposure time of the organometallic complex to e.g. $H_2S$ gas, will, at least partially, determine the certain fraction of organometallic complex that is converted into nanocrystals. Thus, by controlling the fraction of converted organometallic complex by e.g. the exposure time, the refractive index of the optical composition may be adjusted.

The refractive index of the composition may change as the metal cations are in situ converted to nanocrystals. The optical composition may have a tunable refractive index indicating that none, all or a part of the metal cations may be converted to nanocrystals in situ. Preferably, the composition is contacted with the agent to convert the metal cations to nanocrystals in situ until a refractive index of the optical composition corresponding to at least 100% conversion of the organometallic complex to nanocrystals is achieved.

The refractive index (RI) of the optical composition may be any value between that of pure matrix material (e.g. $RI_{silicone}$ is within the range of from 1.4 to 1.6; $RI_{polyarcylate}$ is within the range of from 1.4 to 1.6) and that of the nanocrystals themselves (e.g. within the range of from 2 to 3 at 540 nm). For example, the refractive index of ZnS at 540 nm is 2.6. Preferably, the RI of the optical composition is greater than 1.5, more preferably within the range of from 1.5 to 2.5, such as 1.8.

The method of the present invention may further comprise a step of cross-linking the matrix. The matrix may be cross-linked by using multi-functional reactive monomers which lead to chemical crosslink upon subjecting the monomers to high energy radiation or to heat. Such multi-functional reactive monomers may have reactive groups, such as acrylate groups, vinyl groups, etc.

EXAMPLE 1

Preparation of an Optical Composition

A transparent acrylate monomer matrix was provided with a photoinitiator and polymerization was initiated by UV radiation from a 10 W fluorescent lamp.

The polymerized matrix, having the shape of a film, was neutralized in a solution comprising 3 wt-% cadmium acetate dehydrate, 40 wt-% ethanol, 7 wt-% demineralised water and 50 wt-% dichloromethane. The sample was immersed in the neutralizing solution for half a day. In the neutralization step, the hydrogen in the carboxylic groups was replaced by the metal ion, i.e. the cadmium ion.

Thereafter, the sample was rinsed in a mixture comprising 42 wt-% ethanol, 8 wt-% demineralized water and 50 wt-% dichloromethane in order to wash away ions that have not been bound to the polymer network during the neutralization.

Subsequently, the sample was dried in room temperature (about 20° C.). The residual solvent was removed by heating the sample up to 150° C.

Thereafter, the optical composition comprising CdS nanocrystals was obtained by placing the cadmium-neutralized matrix in a tube comprising dry $H_2S$ gas during 4 hours at atmospheric pressure (about 101.3 kPa) and room temperature.

EXAMPLE 2

Increase in Refractive Index

A composition comprising a matrix, i.e. an acrylate matrix; anionic organic moieties, i.e. carboxylate groups;

and metal cations, i.e. cadmium ions; was contacted with dry H₂S gas in order to form nanocrystals in situ within the acrylate matrix.

The refractive index of the composition was analyzed before and after the contact with the dry H₂S gas. It became clear that a large increase in refractive index was obtained at the contact with the dry H₂S gas due to the formation of nanocrystals in situ.

Figure 5:
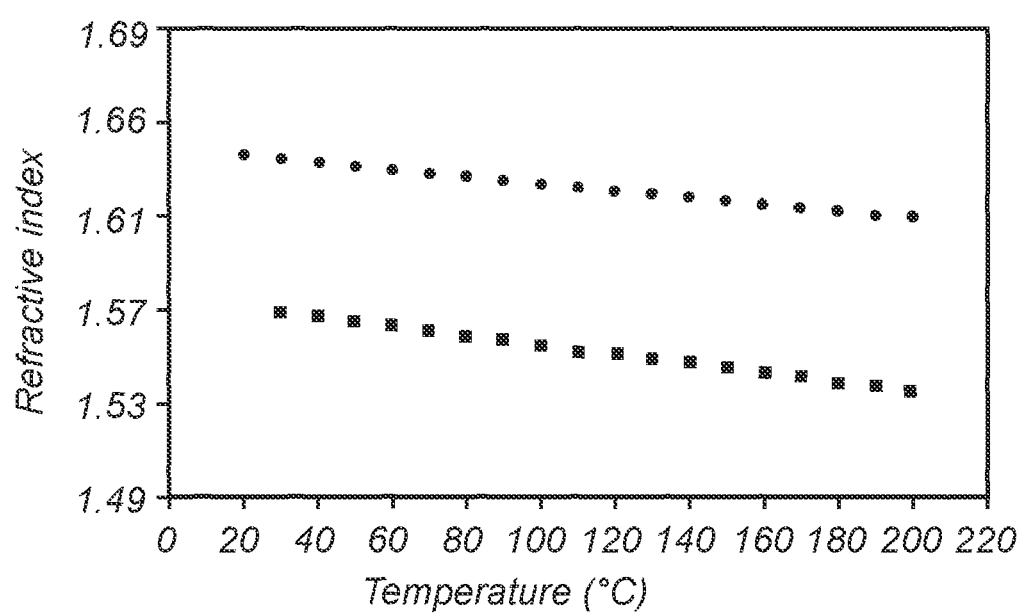
In FIG. 5, the refractive index of an optical composition, according to embodiments of the present invention, before and after contact with $H_2S$ gas, respectively, is shown.

In FIG. 5, the refractive index before and after the contact with dry H₂S gas is shown as a function of temperature. The refractive index as a function of temperature before the composition was contacted with dry H₂S gas is in FIG. 5 shown by black squares. The refractive index as a function of temperature after the composition was contacted with dry H₂S gas is in FIG. 5 shown by black dots.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A composition comprising:
    a transparent matrix comprising an anionic organic moiety,
    metal cations dispersed in the transparent matrix, and
    transparent nanocrystals converted in situ from said metal cations upon contact of said metal cations with an agent comprising at least one element selected from the group consisting of sulfur and selenium;
    wherein said anionic organic moiety and said transparent nanocrystals form an organometallic complex, and
    wherein the transparent matrix is a silicone or a silicone derivative comprising at least one of a polysiloxane and silicone rubber.

2. A composition according to claim 1, wherein the organometallic complex is uniformly dispersed in the matrix.

3. A composition according to claim 1, wherein the matrix comprises a polymer and the anionic organic moiety is an anionic organic side group of said polymer.

4. A composition according to claim 1, wherein said metal ion is selected from the group consisting of zinc ions, cadmium ions, and iron ions.

5. A method of preparing an optical composition comprising the steps of:
    a) providing a composition according to claim 1,
    c) contacting the organometallic complex with an agent comprising at least one element selected from the group consisting of sulfur and selenium, in order to in situ convert at least part of the metal cations into transparent nanocrystals.

6. A method of preparing an optical composition comprising the steps of:
    a) providing a transparent matrix comprising an anionic organic moiety, wherein the transparent matrix is a silicone or a silicone derivative comprising at least one of a polysiloxane and silicone rubber,
    b) dispersing metal cations into the matrix, such that the anionic organic moiety and the metal cations form an organometallic complex,
    c) converting in situ the metal cations into transparent nanocrystals by contacting the metal cations in the organometallic complex with an agent comprising at least one element selected from the group consisting of sulfur and selenium.

7. The method according to claim 6, wherein step c) is carried out until a refractive index of the optical composition corresponding to 100% conversion of the organometallic complex is achieved.

8. The method according to claim 6, further comprising a step of cross-linking the matrix by heat or high energy radiation selected from the group consisting of: UV, gamma rays, and electrons.

* * * * *